United States Patent [19]

Weller et al.

[11] 4,181,904

[45] Jan. 1, 1980

[54] ACOUSTIC-WAVE CONVOLVERS UTILIZING DIFFUSED WAVEGUIDES AND BEAM COMPRESSION TECHNIQUES

[75] Inventors: Joseph F. Weller, Oxon Hill, Md.; James D. Crowley, Menlo Park, Calif.; Thomas G. Giallorenzi, Springfield, Va.

[73] Assignee: The United States of America as represented by the Secretary of the Navy, Washington, D.C.

[21] Appl. No.: 932,248

[22] Filed: Aug. 9, 1978

[51] Int. Cl.[2] ........................ H03H 9/26; H03H 9/30; H03K 5/159; H01L 41/08

[52] U.S. Cl. .................................... 333/153; 333/195; 364/821; 357/26

[58] Field of Search ................................ 333/193-196, 333/150-155; 364/821-823; 332/26; 310/313; 357/26; 330/5.5

[56] References Cited

U.S. PATENT DOCUMENTS 3,816,753 6/1974 Kino ................................ 364/821 X 3,946,333 3/1976 Schmidt ............................... 333/153

OTHER PUBLICATIONS

Defranould et al., "A Saw Piezoelectric Convolver" in Proceedings of the IEEE, vol. 64, No. 5, May 1976; pp. 748-751.

Kino-"Acoustoelectric Interactions in Acoustic-Surface-Wave Devices", in Proc. of the IEEE, May 1976; pp. 724-738.

*Primary Examiner*—Alfred E. Smith
*Assistant Examiner*—Marvin Nussbaum
*Attorney, Agent, or Firm*—R. S. Sciascia; Philip Schneider; William C. Daubenspeck

[57] ABSTRACT

Two input transducers launch oppositely-propagating acoustic surface waves on a piezoelectric substrate. The waves are compressed to a smaller beamwidth and then laterally confined in a diffused channel waveguide where non-linear interaction occurs at increased energy densities due to the beam compression. In one embodiment the beam compression is accomplished in multistrip couplers. In another embodiment, diffused horn-shaped channels are provided for compressing the beamwidth. Both piezoelectric and semiconductor convolvers are disclosed.

6 Claims, 4 Drawing Figures

ACOUSTIC-WAVE CONVOLVERS UTILIZING DIFFUSED WAVEGUIDES AND BEAM COMPRESSION TECHNIQUES

BACKGROUND OF THE INVENTION

This invention relates in general to acoustic-surface-wave devices and especially to increasing the efficiency of the acoustoelectric interactions in such devices. More particularly, this invention relates to increasing the efficiency of the acoustoelectrical interactions in acoustic-surface-wave (ASW) convolvers by utilizing diffused waveguides and beamwidth compression techniques.

The use of ASW devices as convolvers is well known. When two acoustic surface waves pass in opposite directions, it is possible to obtain an output signal at their sum frequency which is proportional to the product of the two signals within the device. This occurs because of a nonlinear interaction between the two acoustic waves propagating along the surface. There are two types of convolvers: (1) the so-called piezoelectric convolver where the nonlinear interaction occurs in the piezoelectric substrate; and (2) the semiconductor convolver where the non-linearity is electronic in nature. In the latter type, the semiconductor may be either piezoelectric (e.g., CdS, CdSe, GaAs) or non-piezoelectric (e.g., Si, Ge). When the semiconductor is piezoelectric, the convolver is somewhat similar in operation to the piezoelectric convolver because the convolution occurs in the substrate, although electronic in nature. In the case where the semiconductor is non-piezoelectric, a piezoelectric substrate is required so that the acoustoelectric interaction can occur. The piezoelectric substrate may be placed adjacent to the semiconductor crystal (the separated medium configuration) or a semiconductor film may be deposited on top of the piezoelectric substrate (the combined medium configuration). A description of the construction and operation of acoustic surface-wave convolvers may be found in the article of G. S. Kino, "Acousto-electric Interactions in Acoustic-Surface-Wave Devices," Proceedings of the IEEE, Vol. 64, No. 5, May 1976.

Since the convolver is based on a nonlinear interaction, its efficiency depends on the power density of the two waves being mixed. It can be shown that the open-circuit output voltage, $V_o(\omega_1+\omega_2)$ can be expressed by $$V_o(\omega_1+\omega_2)=MW^{-1}[P_1(\omega_1)P_2(\omega_2)]^{\frac{1}{2}}$$

where $\omega_1$ and $\omega_2$ are the radial frequencies of each surface wave, W is the beamwidth of the two incident waves, $P_1$ and $P_2$ are incident powers of each acoustic wave, and M is a figure of merit that depends on the type of nonlinear interaction.

As foregoing relationship indicates decreasing the beamwidth increases the open-circuit voltage and the efficiency of the device. There have been at least two attempts to utilize a smaller beamwidth to enhance convolver operation. The first, described in "A SAW Planar Piezoelectric Convolver" by Phillipe Defranould and Charles Maerfeld, Proceedings of the IEEE, Vo. 64, No. 5, May 1976, utilizes a multistrip coupler to obtain beamwidth compression and then couples the smaller beamwidth into a metal waveguide to avoid diffraction losses. While increased performance is obtained, there is a serious limitation to this design because it is applicable only to piezoelectric convolvers. This is due to the fact that metal waveguides short the electric fields at the surface of the piezoelectric and therefore the fields do not extend outside the surface of the piezoelectric. A second beam-compressed convolver is described in "Monolithic Waveguide Zinc-Oxide-on-Silicon Convolver" by B. T. Khuri-Jakab and G. S. Kino, Electronic Letters, Vol. 12, No. 11, May 1976. In this case, the beam compression is obtained by etching a ZnO film, deposited on a silicon substrate, into a horn and channel configuration. This approach is limited by problems associated with producing high quality ZnO films.

U.S. Pat. No. 3,946,338 by R. V. Schmidt discloses that acoustic waveguides may be defined by diffusion of metal into lithium niobate and lithium tantalate. The present inventors have recognized that a waveguide formed by the indiffusion of metal may be used to provide a small-beamwidth convolver having enhanced operation and without the limitations of the prior art devices.

SUMMARY OF THE INVENTION

The present invention provides an acoustic-surface-wave convolver in which acoustic waves propagating in opposite directions on the surface of piezoelectric substrate are compressed to a smaller beamwidth and then laterally confined in a channel waveguide which is formed by diffusion of metal into the substrate. The diffusion of metal into a region increases the acoustic-wave velocity in that region so that the cladding of the wave-guide is an in-diffused region and the core of the waveguide is an area with no metal indiffusion. The nonlinear interaction between the oppositely propagating waves occurs at increased energy densities in the channel waveguide resulting in a more efficient device. Both piezoelectric convolvers and semi-conductor convolvers having improved performance may be constructed according to the present invention.

Further features and advantages of the present invention will be apparent from the following detailed description when considered in conjunction with the accompanying drawing in which:

DESCRIPTION OF THE PREFERRED EMBODIMENT

Figure 1:
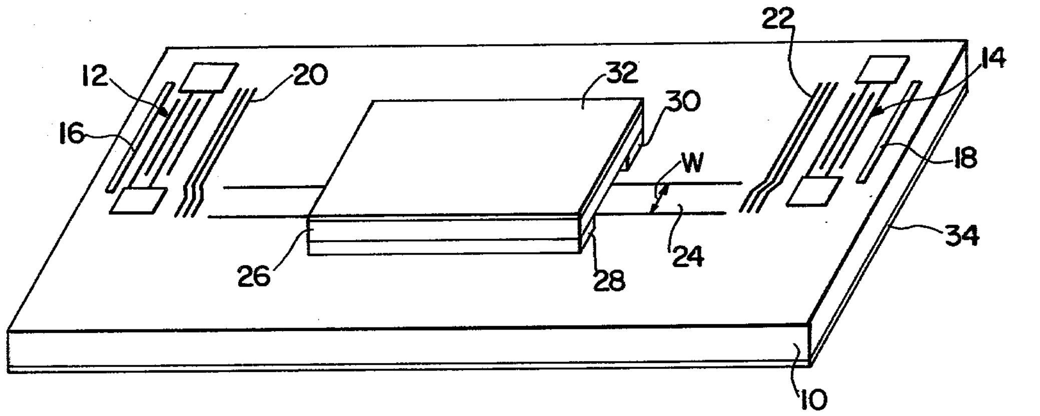
FIGS. 1 and 2 are pictorial illustrations of embodiments of separated-medium semiconductor convolvers according to the present invention.

Referring now to FIG. 1, a separated-medium semiconductor convolver embodying the invention includes a piezoelectric substrate 10 of yz-lithium niobate ($LiNbO_3$) having ASW transducers 12 and 14 disposed on the surface adjacent opposite ends thereof so that oppositely propagating acoustic surface waves are produced when electrical signals are applied to the transducers. The first ASW transducer 14, for example of the interdigital comb type and having an aperture $w_1$, defines an initial propagation path for a first acoustic wave on the surface of the substrate 10. Similarly, the second ASW transducer 14 (which may also be of the interdigital comb type and having an aperture $w_1$) defines an initial propagation path for a second acoustic wave, the direction of the second acoustic wave being opposite to that of the first acoustic wave. Acoustic absorbers 16 and 18 are placed on the substrate 10 behind transducers 12 and 14, respectively, to attenuate reflections from the back surface of the transducers.

Multistrip couplers 20 and 22, acting as energy concentrators, are disposed between the transducers 12 and 14 and have their input apertures disposed to receive the acoustic surface waves generated by transducers 12 and 14, respectively. It is noted that the input aperture of the multistrip couplers should be of sufficient width to receive the entire beamwidth of the propagating surface waves. Each multistrip coupler 20 and 22 compresses the input acoustic surface wave of a beamwidth $w_1$ (assuming negligible beam spreading between the transducer and the input to the coupler) to an output beamwidth $w_1/a$ where a is a numerical factor that depends on the type of multistrip coupler. The factor a is equal to 2 for a symmetrical multistrip coupler, but factors of 15 have been obtained with non-symmetrical multistrip couplers. It is noted that the design of multistrip couplers having efficient power transfer from a large aperture to a small aperture and suitable for use as couplers 20 and 22 is well known to those skilled in the art. For example, a multistrip coupler suitable for use as couplers 20 and 22 is disclosed in U.S. Pat. No. 3,947,783 by Charles Maerfeld.

The compressed acoustic surface waves of beamwidth $w_1/a$ propagate from the output of the multistrip couplers 20 and 22 to opposing ends of a channel waveguide 24 of width w formed by diffusing metal such as titanium from the surface of the substrate 10 into its bulk. The width of the channel waveguide 24 should be chosen so that the acoustic surface waves from the multistrip couplers 20 and 22 are confined to channel region of the device. As is disclosed in the previously cited patent by R. V. Schmidt, the in-diffusion of metals (titanium, nickel, and chronium) into yz-lithium niobate and lithium tantalate produces an increase in the ASW velocity in the indiffused region with no additional acoustic less. Thus when a titanium in-diffused region surrounds an area with no in-diffusion, lateral confinement of an acoustic surface wave can be obtained. Since $LiO_2$ diffuses out of the lithium niobate substrate 10, the regions in which no metallic in-diffusion occurs may be referred to as out-diffused regions. Accordingly the slow-velocity region (i.e., the core of width w) of the waveguide 24 is formed by an out-diffused area of substrate 10 and the fast-velocity region (i.e., the cladding) is formed by an in-diffused area.

In practice, waveguides as utilized in the present invention have been fabricated by sputtering a thin (0.1 $\mu$m) titanium film on the surface of a yz-$LiNbO_3$ substrate using standard photo-lithographic procedures. The titanium is then removed from the area where the waveguide channel is to be formed. The substrate is then placed in a furnace at 1100° C. for 11 hours in an argon atmosphere followed by cooling to room temperature in a oxygen atmosphere. Based on the observation of modes of optical waveguides made by diffusing a 380-Å titanium film at 1100° C. for 6 hours, the diffusion coefficient D is determined to be 1.8 $\mu m^2$/hour. For samples diffused 11 hours, an effective diffusion depth $b \approx 8.8$ $\mu$m is expected with a comparable amount of sideways diffusion.

It is noted that the exact diffusion profile depends on the thickness of the metal film and the temperature and duration of the heating process. The example just described is intended to illustrate a suitable process for forming the waveguide 24 and a person skilled in the art will recognize that variations in the foregoing parameters are possible within the scope of the present invention.

In contrast to the prior-art techniques in which waveguiding is accomplished by reducing the ASW velocity in the core region through the use of metal (or a high-conductivity semiconductor) strip which shorts the electric field at the surface, the lateral confinement of the acoustic surface waves in the present convolver is provided by locally changing the material properties. Thus the electric fields extend beyond the surface of the lithium niobate piezoelectric substrate 10 so that acoustoelectric interactions may occur in an adjacent semiconductor film or crystal.

In order to provide the convolution, a semiconductor crystal 26 is disposed over the waveguide channel 24. The crystal, typically of silicon or germanium, is supported by dielectric rails 28 and 30 which are formed along but not on the channel 24 to avoid mass-loading the surface of the piezoelectric substrate 10. A metal electrode 32 is applied to the top surface of the semiconductor 26 and a ground electrode 34 is applied to the bottom surface of the substrate 10 in order to extract the convolved signal.

Figure 2:
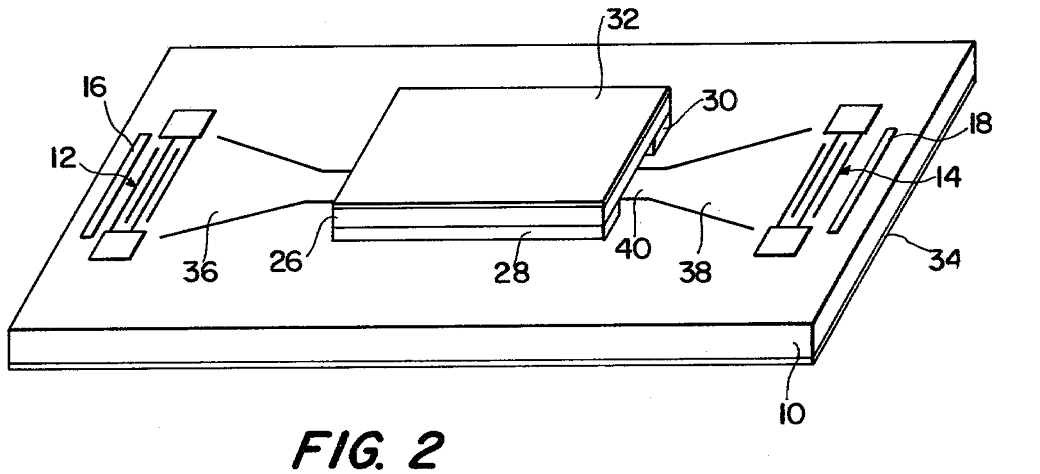

An alternative embodiment of a separated-medium semiconductor convolver is shown in FIG. 2. This embodiment is the same as the device of FIG. 1 except for the means for compressing the beamwidth of the acoustic surface waves. In this case, the acoustic surface waves from transducers 12 and 14 propagate directly into opposite ends of a channel waveguide which has horn-shaped end regions 36 and 38 and a narrow central region 40. The waveguide is formed by metal (titanium) in-diffusion in the same manner as previously described in connection with the waveguide 24 of FIG. 1. The horn-shaped regions 36 and 38 channel the input acoustic waves into the narrow central region 40, thus compressing the waves to a new beamwidth. The convolution and extraction is accomplished in the same manner as in the device of FIG. 1.

As the operation of ASW convolvers is well known, the operation of the devices of FIGS. 1 and 2 will not be described in detail herein. Reference is made to the previously cited article by G. S. Kino for a thorough description of the operation of the various types of of ASW convolvers. However, it is beneficial to note some advantages of the present invention. The devices of FIGS. 1 and 2 provide enhanced convolver operation since the convolution occurs at increased energy densities. In contrast to the waveguide convolvers which use a conducting strip to produce the waveguide and are thus limited to piezoelectric convolvers, the present invention allows the fabrication of a semiconductor convolver in waveguide form. This has the advantage that the semiconductor medium and the piezoelectric medium may be chosen independently to optimize the operation.

The use of a narrow diffused waveguide reduces the difficulty in providing a uniform airgap between the piezoelectric surface and the semiconductor. The required degree of uniformity is more easily maintained due to the smaller width of the diffused waveguide. This particular feature of the present invention offers improved performance in other ASW devices such as phase shifters and amplifiers. Although these are not nonlinear devices, they do utilize acoustoelectric interactions between the fields of the acoustic surface waves and the carriers in the semiconductor and thus require a uniform airgap between the piezoelectric substrate and the semiconductor.

Figure 3:
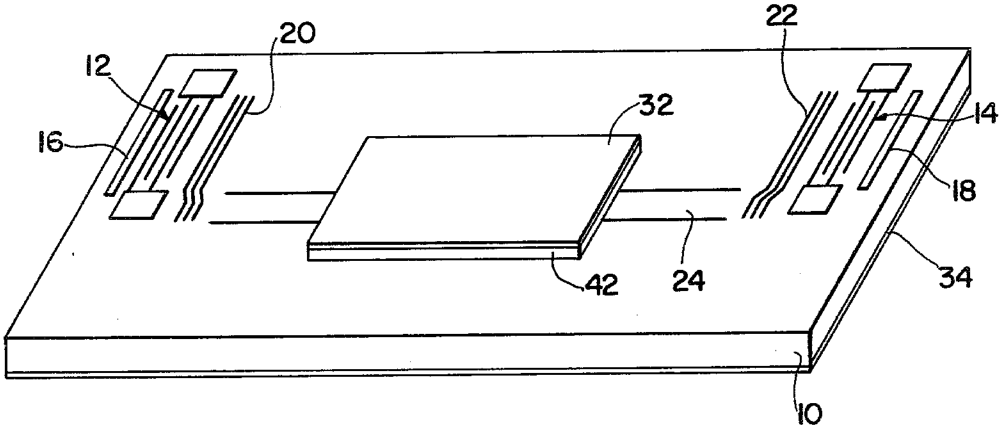
FIGS. 3 and 4 are pictorial illustrations of embodiments of combined-medium semiconductor convolvers according to the present invention.
Figure 4:
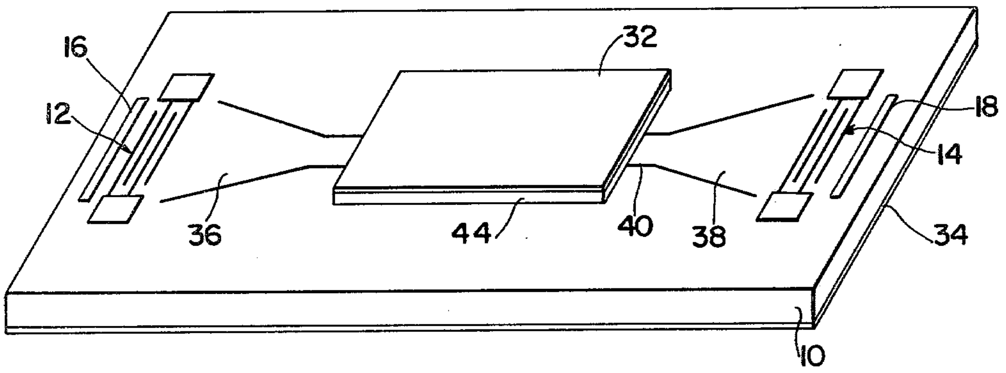

FIGS. 3 and 4 show combined-medium semiconductor convolvers according to the present invention. It can be seen that the device of FIG. 3 is identical to the device of FIG. 1 except that the dielectric rails 28 and 30 and the semiconductor crystal 26 are replaced by a semiconductor thin film 42 which is deposited on the surface of waveguide 24. Similarly the device of FIG. 4 is identical to the device of FIG. 2 except the dielectric rails 28 and 30 are replaced by a semiconductor thin film 44 which is deposited on the surface of the narrow central region 40 of the waveguide. The thin films 42 and 44 are deposited to a thickness that avoids mass loading of the surface and typically are of such materials as CdS, CdSe, or GaAs. The monolithic construction of the devices of FIGS. 3 and 4 makes them easier to fabricate than the devices of FIGS. 1 and 2.

It should be obvious that the beam-compression techniques of the present invention may be used to provide increased efficiency in piezoelectric convolvers. In this case, the semiconductor film would be eliminated from FIGS. 3 and 4 and the top electrode would be placed on the surface of the piezoelectric substrate over the channel waveguide 24 or the narrow central region 40 of FIGS. 3 and 4, respectively.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An acoustic-surface-wave device comprising:
a piezoelectric substrate capable of propagating acoustic wave signals on the top surface thereof;
first transducer means formed on said top surface for generating acoustic surface waves traveling on said top surface along a first direction thereof in response to electrical signals;
second transducer means formed on said top surface for generating acoustic surface waves traveling on said top surface along a second direction thereof in response to electrical signals;
first energy concentrator means for compressing the acoustic surface wave received from said first transducer means to a reduced beamwidth;
second energy concentrator means for compressing the acoustic surface wave received from said second transducer means to a reduced beamwidth;
channel waveguide means for receiving the concentrated acoustic surface waves of reduced beamwidth from the first and second energy concentrator means in opposite ends thereof, said channel waveguide means being formed in said substrate by diffusion of metal into said substrate to increase the acoustic-wave velocity in the in-diffused region, the in-diffused region being the cladding of said waveguide and the non-in-diffused region being the core of said waveguide;
first conductive means forming a ground electrode on the bottom surface of said substrate; and
second conductive means forming at least one electrode on the top surface of said substrate, the signal between said first and second conductive means representing the interaction between the acoustic surface waves generated by said first and second transducer means,
said first and second energy concentrator means comprising first and second horn-shaped channel waveguides, said horn-shaped channel waveguides being formed in said substrate by diffusion of metal into said substrate to increase the acoustic-wave velocity in the in-diffused regions, the in-diffused regions being the cladding of said horn-shaped channel waveguides and the non-in-diffused regions being the core of said horn-shaped channel waveguides.

2. An acoustic-surface-wave device comprising:
a piezoelectric substrate capable of propagating acoustic wave signals on the top surface thereof;
first transducer means formed on said top surface for generating acoustic surface waves traveling on said top surface along a first direction thereof in response to electrical signals;
second transducer means formed on said top surface for generating acoustic surface waves traveling on said top surface along a second direction thereof in response to electrical signals;
first energy concentrator means for compressing the acoustic surface wave from said first transducer means to a reduced beamwidth;
second energy concentrator means for compressing the acoustic surface wave from said second transducer means to a reduced beamwidth;
channel waveguide means for receiving the concentrated acoustic surface waves of reduced beamwidth from the first and second energy concentrator means in opposite ends thereof, said channel waveguide means being formed in said substrate by diffusion of metal into said substrate to increase the acoustic-wave velocity in the in-diffused region, the in-diffused region being the cladding of said waveguide and the non-in-diffused region being the core of said waveguide;
a semiconductor element positioned to have a first surface adjacent and spaced from said top surface of said substrate in the region of said channel waveguide;
first conductive means forming a ground electrode on the bottom surface of the said substrate; and
second conductive means forming a least one electrode on a second surface of said semiconductor element, the signal between said first and second conductive means representing the interaction between the acoustic surface waves generated by said first and second transducer means,
said first and second energy concentrator means comprising first and second horn-shaped channel waveguides, said horn-shaped channel waveguides being formed in said substrate by diffusion of metal into said substrate to increase the acoustic-wave velocity in the in-diffused regions, the in-diffused regions being the cladding of said horn-shaped channel waveguides and the non-in-diffused regions being the core of said horn-shaped channel waveguides.

3. An acoustic-surface-wave device comprising:
a piezoelectric substrate capable of propagating acoustic wave signals on the top surface thereof;
first transducer means formed on said top surface for generating acoustic surface waves traveling on said top surface along a first direction thereof in response to electrical signals;
second transducer means formed on said top surface for generating acoustic surface waves traveling on said top surface along a second direction thereof in response to electrical signals;

first energy concentrator means for compressing the acoustic surface wave received from said first transducer means to a reduced beamwidth;

second energy concentrator means for compressing the acoustic surface wave received from said second transducer means to a reduced beamwidth;

channel waveguide means for receiving the concentrated acoustic surface waves of reduced beamwidth from the first and second energy concentrator means in opposite ends thereof, said channel waveguide means being formed in said substrate by diffusion of metal into said substrate to increase the acoustic-wave velocity in the in-diffused region, the in-diffused region being the cladding of said waveguide and the non-in-diffused region being the core of said waveguide;

a semiconductor film formed on the top surface of said substrate in the region of said channel waveguide;

first conductive means forming a ground electrode on the bottom surface of said substrate; and second conductive means forming at least one electrode on the top surface of said semiconductor film, the signal between said first and second conductive means representing the interaction between the acoustic surface waves generated by said first and second transducer means.

4. The acoustic-surface-wave device as recited in claim 3 wherein the first and second energy concentrator means comprise first and second multistrip couplers, respectively.

5. The acoustic-surface-wave device as recited in claim 3 wherein the first and second energy concentrator means comprise first and second horn-shaped channel waveguides, said horn-shaped channel waveguides being formed in said substrate by diffusion of metal into said substrate to increase the acoustic-wave velocity in the in-diffused regions, the in-diffused regions being the cladding of said horn-shaped channel waveguides and the non-in-diffused regions being the core of said horn-shaped channel waveguides.

6. An acoustic-surface-wave device as recited in claim 3 wherein said piezoelectric substrate is selected from the group consisting of lithium niobate and lithium tantalate and the metal diffused in said substrate is selected from the group consisting of titanium, chromium and nickel.

* * * * *